INVENTORS
HIROSHI SHIBA
HIDEO TSUNEMITSU
by
Sandoe, Hopgood & Calimafde
ATTORNEYS June 26, 1973 HIROSHI SHIBA ET AL 3,741,880

METHOD OF FORMING ELECTRICAL CONNECTIONS
IN A SEMICONDUCTOR INTEGRATED CIRCUIT

Filed Oct. 22, 1970 3 Sheets-Sneet 2

INVENTORS
HIROSHI SHIBA
HIDEO TSUNEMITSU by
Sandoe, Hopgood & Calimafde
ATTORNEYS INVENTORS
HIROSHI SHIBA
HIDEO TSUNEMITSU
by
Sandoe, Hopgood & Calimafde
ATTORNEYS 3,741,880

METHOD OF FORMING ELECTRICAL CONNECTIONS IN A SEMICONDUCTOR INTEGRATED CIRCUIT

Hiroshi Shiba and Hideo Tsunemitsu, Tokyo, Japan, assignors to Nippon Electric Company Limited, Tokyo, Japan Filed Oct. 22, 1970, Ser. No. 83,140
Claims priority, application Japan, Oct. 25, 1969, 44/85,358; Oct. 30, 1969, 44/87,072
Int. Cl. C23b *5/46, 5/48*
U.S. Cl. 204—15 18 Claims

ABSTRACT OF THE DISCLOSURE

A method of forming electrical connections in a semiconductor integrated circuit device in which an anodizable metallic material such as aluminum is formed on a substrate. Anodic oxidation is then performed to form a thin porous oxide film of the metallic material. The surface of the porous oxide film is then selectively covered with a photoresist. The exposed surface of the metallic material is then anodized to form a non-porous metallic oxide film, which thereafter serves as a mask during the formation of the wiring channel.

Figure 1:
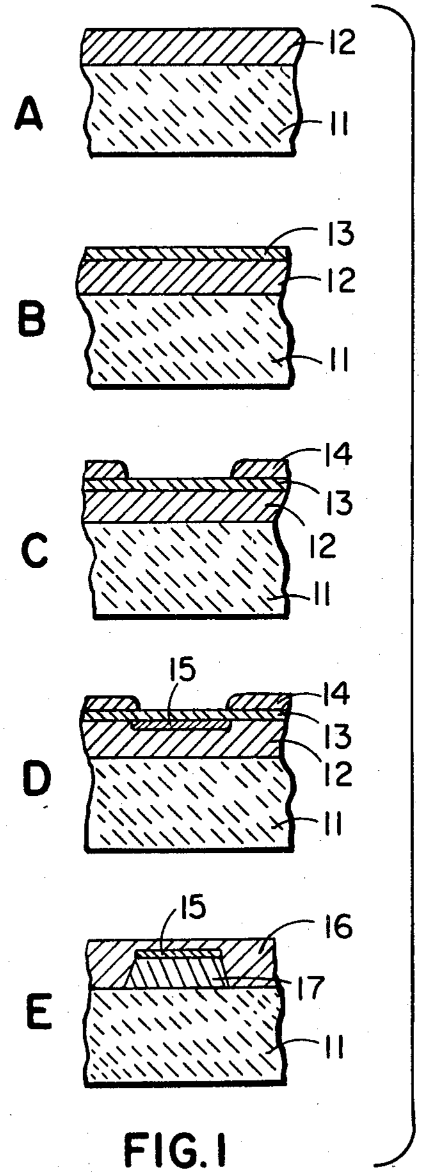

This invention relates to a method of producing electrical connections, and particularly to an improvement of the selective anodic oxidation technique for producing electrical interconnections in a semiconductor integrated circuit.

An aluminum selective etching method has been widely employed for forming the electrical connections in an integrated circuit. In this method aluminum is evaporated onto the surface of a semiconductor substrate the insulator or conductor is thereafter covered with an insulating film, photoresist is applied to the aluminum film for washing, and the aluminum film except at the areas which are to become the electrical connections is removed by etching. According to this method, however, it is often the case that the thickness of the aluminum film becomes uneven, etching is not uniform due to the inhomogeneous etching liquid, and it is difficult to achieve accurate control of the shape of the electrical connections.

An object of this invention is to provide a new and improved method of easily and securely producing a conducting path for electrical connection in a semiconductor integrated circuit.

Another object of this invention is to provide a process for easily and securely producing a wiring semiconductor substrate having highly reliable wiring channels, in which the shape of the wiring channel can be controlled with high accuracy.

Still another object of the invention is to provide a method for producing a highly reliable semiconductor device, in which the electrodes can be formed easily and with high accuracy.

A selective anodic oxidation technique such as that described in patent application Ser. No. 833,095, entitled Semiconductor Device, filed on June 13, 1969, and assigned to the assignee of this application, has been proposed to replace the conventional selective etching method to afford a highly reliable multi-layer interconnection structure of a semiconductor device.

However, by the prior art technique in which the specific area of the deposited aluminum surface is directly covered with photoresist, it is sometimes the case that the edge of photoresist does not withstand the anodizing treatment and thus oxide growth is permitted to occur to a considerable length inside beneath the photoresist. This is supposedly attributable to the heat of reaction due to the chemical process of anodization. In order to overcome this difficulty, the present invention provides for the initial formation of a thin aluminum oxide film on the entire surface of the deposited aluminum. Thus, by the addition of a few steps to the prior art, the shape of the anoducting, paths or wiring channels can be so formed to correspond faithfully to the intended pattern determined by the original glass mask. Furthermore, by the process of the present invention, the electric field acting during the following process of selective anodization is distributed both onto the photoresist part and to the initially formed aluminum oxide part. Effectively, therefore, the electric field acting in the photoresist can be weakened, and it becomes possible that the non-porous aluminum oxide which is to serve as the mask against selective anodic oxidation can be formed at a higher forming voltage than in the prior art process. This means an improvement in the resistivity of the non-porous aluminum oxide as a mask against the formation of porous aluminum oxide in the following step, which is to the great advantage of the process.

Furthermore, an experimental result has indicated that photoresist adheres more steadily to the anodized aluminum surface than to the aluminum surface itself. Thus photoresist is desirably applied not on the immediate aluminum surface as in the prior art, but on the anodized surface of aluminum as in the present invention to secure its adhesion.

With all these advantages combined, this invention, affords a process which enables accurate wiring pattern formation more securely than can be achieved by the practice of the prior art technique proposed in the specification of said copending application S.N. 833,095 by introducing the initial formation of the anodized oxide on the entire surface of the deposited aluminum.

Additionally, if the deposited aluminum surface is changed into oxide by anodization prior to the photoresist process as in the present invention, it becomes chemically stable in a given atomsphere as well as mechanically resistant against any possible scratches. Thus, a whole structure can be set aside without any fear of aluminum degradation only if it has undergone this stage. Then it is ready to be processed to the next stage of photoresist application at any time. This increases the efficiency in production.

It is noted that other anodizable metals, or film-forming metals, such as tantalum, niobium and titanium may be used instead of or together with aluminum.

Figure 2A:
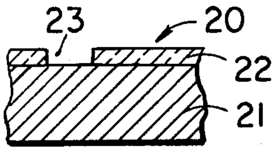
Figure 2B:
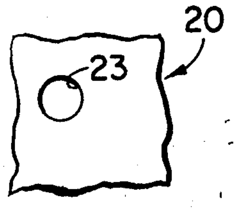
Figure 3:
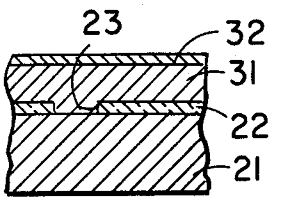
Figure 4A:
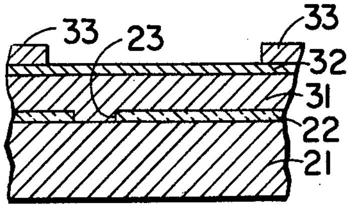
Figure 4B:
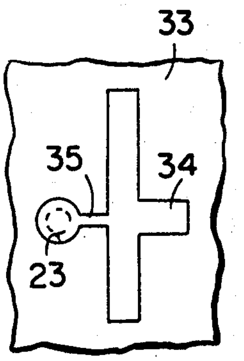
Figure 5:
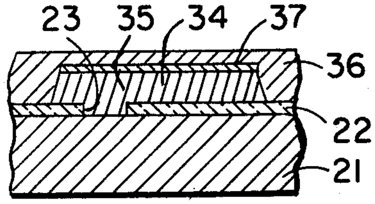
Figure 6A:
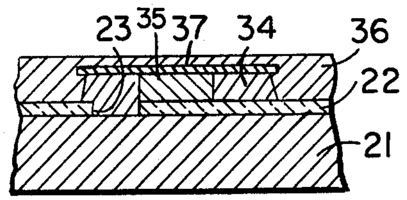
Figure 6B:
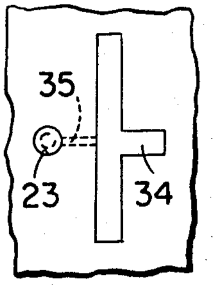

The invention will be better understood from the following description taken in connection with the accompanying drawings in which:

FIGS. 1A–E are cross sectional views illustrating the process of producing the wiring substrate according to a preferred embodiment of this invention;

FIGS. 2(A), 3, 4(A), 5 and 6(A) are cross sectional views and FIGS. 2(B), 4(B) and 6(B) are plan views, illustrating in sequence a preferred process for fabricating the wiring substrate embodying this invention; and FIGS. 7, 8(A), 9, 10, 11(A), 12, 13, 14(A), 15 and 16(A) are cross sectional views and FIGS. 8(B), 11(B), 14(B) and 16(B) are plan views, illustrating in sequence the processes for producing a semiconductor device according to another embodiment of this invention.

FIGS. 1A–E illustrate a preferred process for producing a multilayer wiring substrate according to this invention, which selective anodic oxidation technique is employed. First, an aluminum thin film 12 of 2 microns in thickness is evaporated uniformly onto the flat surface of an insulating substrate 11 as shown in FIG. 1(A), and a first anodizing process is applied to entire surface of the aluminum thin film 11 to form a porous aluminum oxide film 13 of about 0.1 micron in thickness as shown in FIG.

1(B). In the process of forming porous aluminum oxide film 13, it is desirable to use 10% chromium trioxide dissolved in water, with the application of a constant forming voltage of approximately 10 volts for a period of ten minutes.

Then, a photoresist 14 is applied to the substrate surface and overlies these areas of the substrate, except for areas which are to become the wiring channels, as shown in FIG. 1(C). Using the photoresist 14 as a mask, a second anodizing process is applied thereto, to form a non-porous aluminum oxide film 15 beneath the porous film 13 in the area having no photoresist, as shown in FIG. 1(D). In the process of forming the non-porous aluminum oxide film 15, it is desirable that a solution of ethylene glycol saturated with ammonium borate is used, with the application of a constant forming voltage of about 80 volts for a period of about 15 minutes.

After this process, the photoresist 14 is removed by using a remover, and the non-porous aluminum oxide film 15 formed on the areas which are to serve as the wiring channels is used as a mask while all the aluminum film around the wiring channels 17 are anodized into a porous aluminum oxide film 16 as shown in FIG. 1(E). In this process for forming the porous aluminum oxide film 16*a* 2% dilute sulphuric acid solution of 20° C. is used, with the application of a constant forming voltage of about 20 volts.

In the above described process, it is easy to apply selective anode-oxidation to the metal thin film deposited thereto by an evaporation or sputtering process and thus to form an aluminum oxide film which is to act as an electrically insulating material. The surface of the aluminum oxide film formed in the above manner is nearly flat, and this facilitates the succeeding production process. According to this embodiment, the multilayer wiring is formed in a manner such that openings are disposed in the non-porous aluminum oxide film in those portions through which electrical connections are to be established with an upper layer, and the foregoing process is done repeatedly. To provide openings in the non-porous aluminum oxide film, it is desirable that, for example, a mixture of 35 grams of chromium trioxide and 20 cc. of phosphoric acid, be diluted into one liter of water, and that this solution be used for the etching at a liquid temperature of 70 to 75° C.

FIGS. 2–6 illustrate another preferred process for producing a wiring substrate on a semiconductor device 20 according to this invention. In this embodiment, a substrate 21 of conductive material with a coating of a thin insulating film 22 is used for the purpose of the insulating substrate. Selective etching is applied to the insulating film 22 which covers the surface of the substrate 21 whereby an opening 23 formed in film 22 to directly communicate with conductive substrate 21 is disposed in a predetermined area of the substrate, as shown in FIGS. 2(A) and 2(B). Then, in the same manner as in the foregoing process, an aluminum thin film 31 is evaporated onto the surface of the substrate 21 as shown in FIG. 3 and is subjected to the first anodizing process described above to form an aluminum oxide film 32 on film 31. Then, the surface of thus formed aluminum oxide film 32 except for a channel area 34 which is to become the wiring channel, and the channel area 35 which is to establish electric connection between the wiring channel and the opening 23 is covered with a photoresist 33 all as shown in FIGS. 4(A) and 4(B), and the second anodization procedure is carried out. The photoresist is then and the non-porous aluminum oxide film 37 formed by the second anodizing process is used as the mask in converting all the aluminum therearound into porous aluminum oxide 36 (FIG. 5). In this process, an anodizing voltage is applied both to the aluminum film 31 and to the conductive substrate 21. The anodizing currents is supplied both from the aluminum-evaporated film 31 and from the substrate 21. The current from the aluminum-evaporated film stops when the unmasked aluminum is converted into aluminum oxide which is an electrically insulating material.

As long as current from the substrate 21 flows in the wiring channel 34 through the connection channel 35, anode-oxidation continues. Anode-oxidation in this area is automatically stopped when the narrowest part of the connection channel 35 is completely anode-oxidized into aluminum oxide and the anodizing current is thus no longer supplied to the wiring channel 34. (Refer to FIGS. 6(A) and 6(B).) In this manner, the invention permits the formation of the wiring channel automatically at a high accuracy regardless of small variation in the anodizing voltage so long as the width of the narrowest part of the connection channel is accurately determined.

In the above described production process, the substrate 21 may be so arranged that the surface of a flat plate made of an insulating material is coated with a metal film such as an aluminum film, and the surface of the metal film is coated with an insulating material such as silicon dioxide.

The wiring structure comprising the wiring layer having wiring channels and insulating films formed by the process as illustrated in the foregoing embodiment includes an increment of volume due to the chemical conversion of aluminum into aluminum oxide. In spite of such volume increment, the surface of this wiring substrate is markedly flat in comparison with that of the conventional wiring substrate in which the wiring channels are formed by a selective etching or printing process. Since the wiring channels according to this invention are firmly protected by the aluminum oxide, the wiring substrate having such a wiring layer is well protected from scratches or failures caused by the deposit of dust during its production process.

This invention is particularly featured by the fact that raised or hollow portions are not produced on the surface of the wiring substrate after the installation of an additional wiring layer, and therefore this wiring structure can be applied to multilayer wiring substrate having more than two layers without sacrificing high reliability.

Figure 9:
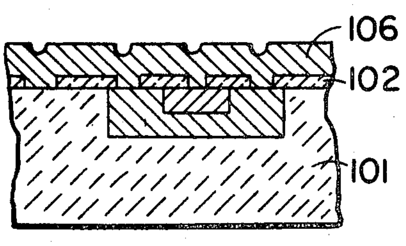
Figure 10:
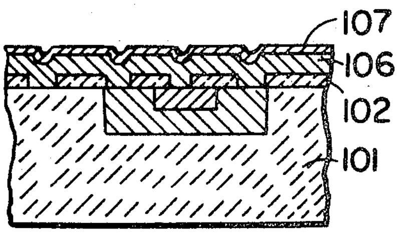

FIGS. 7–16 illustrate a preferred production method of a semiconductor device embodying this invention. The surface of an N-type semiconductor substrate 101 (FIG. 7) provided with specific PN junctions and covered with a silicon oxide film 102 is coated with photoresist (not shown), and the silicon oxide film 102 is selectively removed by etching to form an opening 103 communicating directly with the semiconductor substrate 101, and openings 104 and 105 communicating with the base region and emitter region respectively as shown in FIGS. 8(A) and 8(B). An aluminum film 106 of 1.5 microns in thickness is evaporated uniformly onto the surface of the semiconductor substrate 101 as shown in FIG. 9. A first anodizing process is then applied to the complete surface of the aluminum film 106 whereby a porous aluminum oxide film 107 of about 0.1 micron in thickness is formed as shown in FIG. 10. To form porous aluminum oxide film 107, it is desirable that a wafer be immersed in a 10% chromic acid solution, with a constant forming voltage of about 10 volts being applied for about ten minutes.

Figure 11A:
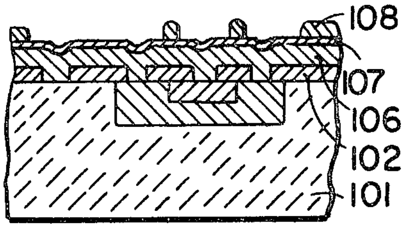
Figure 11B:
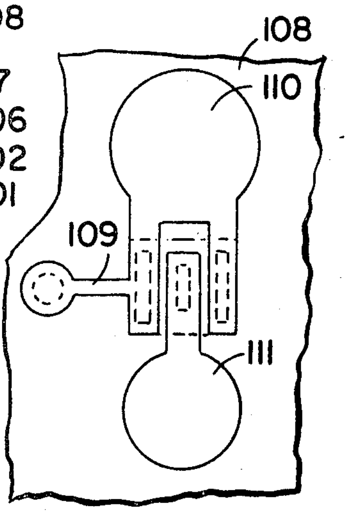
Figure 8A:
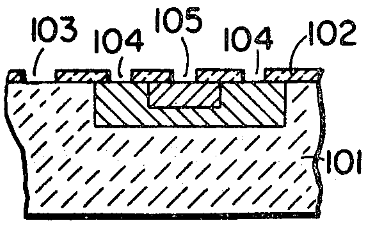
Figure 8B:
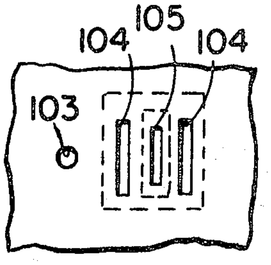
Figure 12:
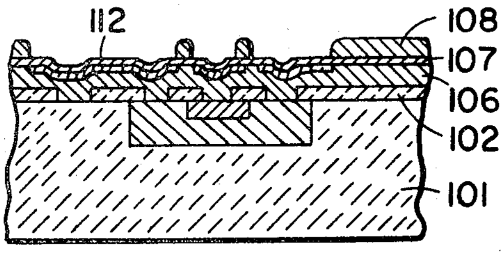

Then, a photoresist 108 is applied to the surface of the wafer to cover the areas except for the emitter electrode 111 and the base electrode 110 having a communicating channel 109 with a width of 3 microns as shown in FIGS. 11(A) and 11(B). Using the photoresist 108 as the mask, the second anodizing treatment is applied thereto whereby a non-porous aluminum oxide layer 112 is formed in the region having no photoresist, as shown in FIG. 12. In this second anodizing process, a forming solution of ethylene glycol saturated with boric acid ammonium is used at a constant forming voltage. It is desirable that the forming voltage is 80 volts and the forming time is about 15 minutes, which results in a non-porous aluminum oxide film of about 0.1 micron in thickness.

Figure 14A:
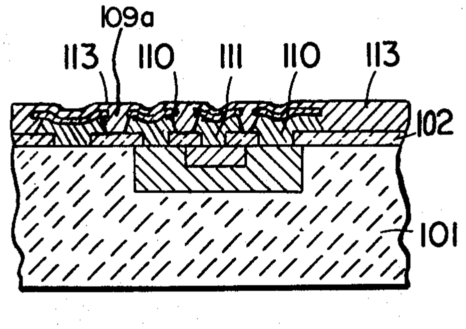
Figure 14B:
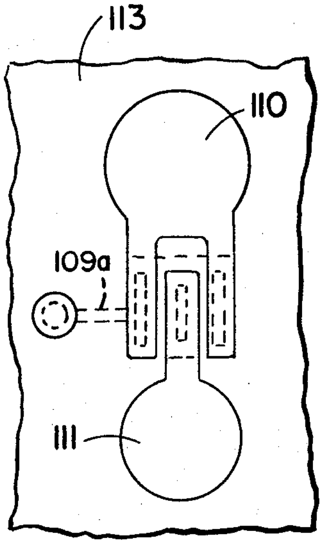
Figure 13:
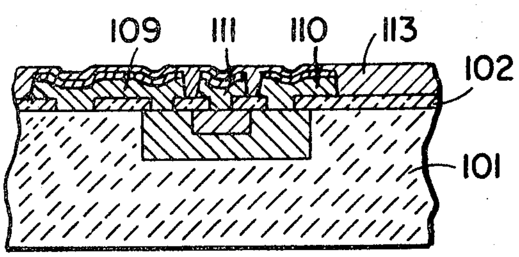

Then, the photoresist 108 is removed by the use of a remover. Using non-porous aluminum oxide 112 as the mask, the third forming process is applied thereto whereby all the aluminum except for the area covered by the non-porous aluminum oxide layer 112 is converted into a porous aluminum oxide 113, as shown in FIG. 13. The third forming process is done using a 2% dilute sulphuric acid solution at normal temperature, with a constant forming voltage of 20 volts being applied to the wafer. In this embodiment, the areas except for those masked are converted into aluminum oxide for about 10 minutes and, about 15 minutes after this process, the communicating channel 109 is converted into aluminum oxide, 109*a*, as shown in FIGS. 14(A) and 14(B).

Figure 15:
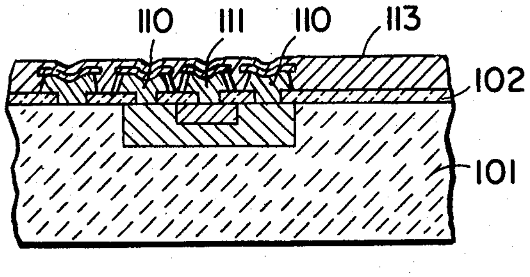
Figure 16A:
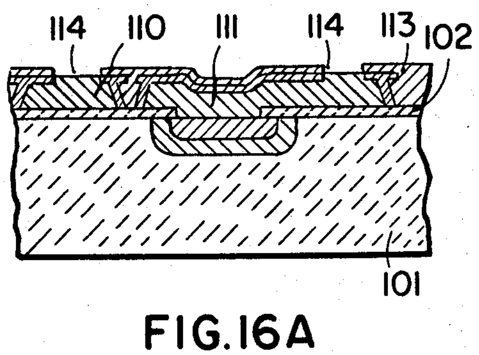
Figure 16B:
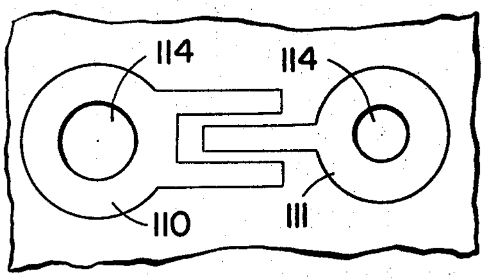
Figure 7:
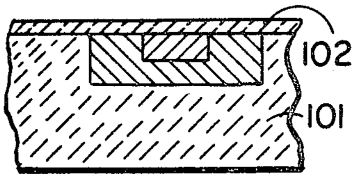

Finally, the treatment for forming non-porous aluminum oxide is performed whereby stable non-porous aluminum oxide is formed on the sides of aluminum electrodes 110 and 111, as shown in FIG. 15.

In this final process, constant current forming is done first. When the forming voltage reaches the sum of the break-down voltage of the collector junction and a voltage of between 100 and 150 v., the constant current forming is switched to constant voltage forming. This voltage forming is done for 30 to 60 minutes. In this process, the non-porous aluminum oxide film does not grow to more than a certain definite thickness even after a long period of time since this process is dependent only on the forming voltage. In this embodiment, the non-porous aluminum oxide film was observed to grow to about 0.2 micron in thickness.

After the above process, an opening 114 through which an external lead is to be connected is disposed in the desired area, and thus the formation of electrode is completed. (See FIGS. 16(A) and 16(B).)

The electrode of the semiconductor device produced according to the foregoing method has a highly accurate shape. In addition, the periphery of the electrode is covered with chemically stable aluminum oxide and, consequently, a highly reliable semiconductor can be obtained. Another noteworthy feature of this invention is that the electrode formation can be automatically controlled and thus the productivity can be markedly increased.

The prior art anode-oxidation technique has not been applicable when forming NPN transistor because of a polarity problem in the anode forming process. More specifically, the anode-oxidation method is such that a wafer to which a positive forming voltage is applied is immersed in the forming solution to apply selective anode-oxidation on the aluminum film, whereby the aluminum film except for the areas which are to become the electrodes is converted into aluminum oxide which is an insulating material. Thus the electrodes are formed. The most important point of this method is that the forming current is supplied from the substrate through more than one adjacent electrode.

The forming current is supplied both from the aluminum-evaporated film side and from the substrate side. The current from the aluminum-evaporated film side is gradually reduced as anode-oxidation progresses, and is finally stopped. Therefore, in order to perfectly isolate the adjacent electrodes from each other, it is necessary to supply the forming current from the substrate side through the electrode.

Nevertheless, in the NPN transistor, the forming voltage applied to the N-type substrate is applied reversely to the collector junction and, hence, the forming current can neither be supplied from the base electrode or emitter electrode. In short, it is impossible to perfectly isolate the electrodes from each other according to the prior art.

In a semiconductor device having the structure in which the forming voltage is prevented by the PN junction and is not applied directly to the electrode regions as in an NPN transistor, an opening is disposed in the silicon oxide film (which is to serve as the mask in the selective anode-oxidation process) to communicate directly with the substrate not by way of the PN junction, and a current communicating channel having a specific narrow portion is provided to connect the electrodes, as illustrated in the last described embodiment. In this structure, the forming voltage is applied to more than one adjacent electrode directly from the substrate via the communicating channel, anode-oxidation continues even after the unmasked aluminum film has been transformed into aluminum oxide, and the forming current is kept supplied from the substrate until the narrow portion of the communicating channel is anode-oxidized from its side and transformed into aluminum oxide. When the forming current thus stops, the anode-oxidation stops automatically.

In other words, the invention permits the formation of electrode automatically at a high accuracy regardless of small variation in the forming voltage so long as the width of the most narrow portion of the communicating channel is accurately defined.

The invention thus makes it possible to realize a method of producing semiconductor devices in a manner such that the forming current is supplied to an electrode, which corresponds to the junction whose break-down voltage and punch-through voltage, are lower than the forming voltage or the junction whose leakage current is large, by way of such junction even after the communicating channel through which the current flows from the substrate has vanished, and the anode oxidation process is continued until the whole electrode is transformed into aluminum oxide. During this process, it is possible to reject automatically the semiconductor elements with defective junctions by setting the forming voltage at a value to be sufficient to continue anode-oxidation.

While specific embodiments of the invention have been described in detail, it is particularly understood that the invention is not intended to be limited thereto or thereby.

What is claimed is:

1. A method of producing an electrical connection comprising the steps of coating one main surface of a substrate with an anodizable metallic material to a substantially uniform thickness; performing anodic oxidation to form a thin oxide film on the surface of said metallic material; selectively coating the surface of said anodized thin oxide film with a photoresist; anodizing the surface of said metallic layer except for the area coated with said photoresist to selectively convert the surface of said metallic layer into a non-porous metallic oxide film; removing said photoresist; and thereafter converting said metallic layer except for the area whose surface is coated with said non-porous film into a porous metallic oxide layer.

2. The method of claim 1, in which said metallic material is aluminum, said anodized thin oxide film being formed of alumina.

3. The method of claim 1, in which said anodized thin oxide film is a porous film.

4. The method of claim 1, in which said substrate comprises a semiconductor body, and an insulating film covering at least a part of the surface of said semiconductor body.

5. The method of claim 1, in which said substrate is formed of an insulating material.

6. The method of claim 1, in which said substrate comprises a conducting material, and an insulating film covering at least a part of the surface of said conducting material.

7. The method of claim 1, in which said substrate comprises a plate of an insulating material, a metal film coating the surface of said plate, and an insulating film covering at least a part of the surface of said insulating film.

8. The method of claim 1, in which said anodic oxidation performing step, said surface anodizing step, and said metallic layer converting step each comprises the step of applying a forming voltage, the forming voltage applied in said metallic layer converting step being higher than the forming voltage applied in said anodic oxidation performing step and lower than the forming voltage applied in said surface anodizing step.

9. The method of claim 2, further comprising the steps of respectively using a chromic acid solution, a solution of ethylene glycol saturated with boric acid ammonium, and a dilute sulphuric acid solution as a forming solution in said anodic oxidation performing step, in said surface anodizing step and, in said metallic layer converting step.

10. A method of producing electrically conductive paths on a substrate comprising the steps of depositing an aluminum layer on said substrate, converting by a first anodic oxidation step the whole surface of said aluminum layer into a thin, porous alumina film, applying to the surface of said thin, porous alumina film a resist pattern defining a region other than the intended conductive paths, performing a second anodic oxidation step to convert the surface of the intended conductive paths of said aluminum layer underlying said thin, porous alumina film exposed by said resist pattern into a non-porous alumina film, removing said resist pattern, and thereafter converting by a third anodic oxidation step the region of said aluminum layer other than the intended conductive paths into a porous alumina layer.

11. The method of claim 10, in which said substrate comprises a semiconductor wafer having at least one circuit element being formed therein, an insulating film covering the surface of said semiconductor wafer, and windows through which the intended conductive paths of said aluminum layer are to be made in contact with said semiconductor wafer provided in said insulating film.

12. The method of claim 10, further comprising the steps of applying a forming voltage in said first, second, and third anodic oxidation steps, the forming voltage applied in said third anodic oxidation step being higher than the forming voltage applied in said first anodic oxidation step and lower than the forming voltage applied in said second anodic oxidation step.

13. The method of claim 10, in which said first, second and third anodic oxidation steps are respectively performed by using, as a forming solution, an aqueous solution of chromic acid, a solution of ethylene glycol saturated with boric acid ammonium, and an aqueous solution of dilute sulphuric acid.

14. A method of producing an electrically conductive path on a substrate having a metallic surface, comprising the steps of coating said metallic surface of said substrate with an insulating film, forming an opening in said insulating film, depositing a metallic layer of an anodizable metal over said insulating film, selectively anode-oxidizing said metallic layer by applying an anodizing voltage to both said metallic layer and said metallic surface of said substrate to leave a land of said anodizable metal, said land being electrically connected through said opening with said metallic surface of said substrate, and converting by anode-oxidation a part of said land into an oxide of said anodizable metal to divide said land into two portions, one of said two portions being electrically connected through said opening with said metallic surface of said substrate, and the other of said portions being isolated from said metallic surface of said substrate by said oxide of said anodizable metal, whereby an isolated conductive path is obtained on said substrate.

15. The method of claim 14, in which said part of said one of said conductive paths is narrower in width than the remainder of said one conductive path.

16. A method of producing a semiconductor device comprising the steps of forming a first region of P-type conductivity in a semiconductor substrate of N-type conductivity, forming a second region of N-type conductivity in said first region, coating the surface of said substrate with an insulation film, forming first, second, and third openings in said insulation film on said first region, on said second region, and on said substrate, respectively, depositing a metallic layer of an anodizable metal on said insulation film, said metallic layer being respectively electrically connected with said first region, said second region, and said substrate through said first, second and third openings, selectively anode-oxidizing said metallic layer by applying an anodizing voltage to both said metallic layer and said substrate to form first and second conductive paths of said anodizable metal, said first conductive path being at this time electrically connected with both said first region and said substrate and separated from said second conductive path by an oxide of said anodizable metal, said second conductive path being electrically connected with said second region, and thereafter converting by anode-oxidation a part of said first conductive path into an oxide of said anodizable metal, said first conductive path being separated by said part into two mutually spaced portions, one of said portions being connected with said first region through said first opening, and the other of said portions being connected with said substrate through said third opening, thereby to establish a conductive path connected to said P-type region which is separated from the N-type substrate by a PN-junction back-biased by the anodizing voltage applied to said substrate.

17. The method of claim 16, in which said anodizable metal is selected from the group consisting of aluminum, tantalum, niobium, and titanium.

18. The method of claim 16, in which said part of said first conductive path is narrower in width than the remainder of said first conductive path.

References Cited

UNITED STATES PATENTS

| | | | |
|---|---|---|---|
| 3,468,728 | 9/1969 | Martin | 29—577 |
| 3,169,892 | 2/1965 | Lemelson | 317—234 |
| 3,461,347 | 8/1969 | Lemelson | 317—101 |
| 3,337,426 | 8/1967 | Celto | 204—15 |
| 3,634,203 | 1/1972 | McMahon | 204—15 |
| 3,528,090 | 9/1970 | Van Laer | 204—15 |
| 3,506,887 | 4/1970 | Gutteridge | 204—15 |
| 3,148,129 | 9/1964 | Basseches et al. | 204—38 |

JOHN H. MACK, Primary Examiner

T. TUFARIELLO, Assistant Examiner

U.S. Cl. X.R.

29—577; 204—42; 317—101 R, 235 R